(12) United States Patent
Tomioka et al.

(10) Patent No.: US 7,947,999 B2
(45) Date of Patent: May 24, 2011

(54) LUMINESCENT DEVICE AND METHOD FOR MANUFACTURING THE SAME

(75) Inventors: Taizo Tomioka, Kanagawa-ken (JP); Takahiro Suzuki, Kanagawa-ken (JP); Hiroyuki Tokubo, Hyogo-ken (JP); Yukinori Aoki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 529 days.

(21) Appl. No.: 11/616,161

(22) Filed: Dec. 26, 2006

(65) Prior Publication Data

US 2007/0145403 A1 Jun. 28, 2007

(30) Foreign Application Priority Data

Dec. 27, 2005 (JP) ................................ P2005-376253

(51) Int. Cl.
*H01L 33/00* (2010.01)
(52) U.S. Cl. ......... 257/99; 257/78; 257/81; 257/E23.01; 250/239
(58) Field of Classification Search ............ 257/77, 257/78, 99, 79, E23.01, E23.141, E33.066, 257/81; 313/512; 385/16; 250/239
See application file for complete search history.

(56) References Cited

U.S. PATENT DOCUMENTS

| | | | | |
|---|---|---|---|---|
| 4,977,317 A | * | 12/1990 | Iwashima | 250/239 |
| 5,647,034 A | * | 7/1997 | Matsuda et al. | 385/16 |
| 5,907,151 A | * | 5/1999 | Gramann et al. | 250/214.1 |
| 2003/0107316 A1 | * | 6/2003 | Murakami et al. | 313/512 |
| 2003/0189213 A1 | * | 10/2003 | Igaki et al. | 257/81 |
| 2004/0135156 A1 | * | 7/2004 | Takenaka | 257/79 |
| 2005/0236638 A1 | * | 10/2005 | Tsukagoshi | 257/99 |
| 2006/0022216 A1 | * | 2/2006 | Chikugawa | 257/99 |
| 2006/0043401 A1 | * | 3/2006 | Lee et al. | 257/99 |
| 2006/0086940 A1 | * | 4/2006 | Wang et al. | 257/79 |

FOREIGN PATENT DOCUMENTS

| | | |
|---|---|---|
| CN | 1366714 A | 8/2002 |
| JP | 2001-185763 | 7/2001 |
| JP | 2002-252373 | 9/2002 |
| WO | WO 01/59851 A1 | 8/2001 |

* cited by examiner

*Primary Examiner* — Matthew E Warren
*Assistant Examiner* — Fang-Xing Jiang
(74) *Attorney, Agent, or Firm* — Oblon, Spivak, McClelland, Maier & Neustadt, L.L.P.

(57) ABSTRACT

A luminescent device including a die pad lead composed of an inner lead and an outer lead, a case for uniting the inner lead, a light emitting diode chip mounted on a first predetermined position of one main surface of the inner lead, and a transparent sealing material portion for sealing the light emitting diode chip and a part of the one main surface. The case seals the inner lead other than an area sealed by the transparent sealing material portion, and the inner lead of the die pad lead has bending portions at least two places including a first bending portion and a second bending portion. A rear of the first predetermined position in the inner lead of the die pad lead is exposed outside the case, and the second bending portion is formed in the case so that the outer lead extends from a side of the case.

15 Claims, 4 Drawing Sheets

(a)

(b)

LUMINESCENT DEVICE AND METHOD FOR MANUFACTURING THE SAME

CROSS-REFERENCE TO RELATED APPLICATIONS

This application is based upon and claims the benefit of priority from the prior Japanese Patent Application No. 2005-376253, filed on Dec. 27, 2005; the entire contents of which are incorporated herein by reference.

BACKGROUND OF THE INVENTION

1. Field of the Invention

The present invention relates to a luminescent device and a method for manufacturing the same, and more particularly to a luminescent device composed of a light emitting diode having high heat radiation and a method for manufacturing the same.

2. Description of the Background

In a conventional luminescent device, a pair of leads is combined by the transparent resin which was shaped by molding. At an end of an inner lead of a first lead, a light emitting diode is mounted, and an electrode of the light emitting diode and an end of an inner lead of a second lead are connected by a metal wire.

Outer leads of the first and second leads are bent in a gull wing shape or a J shape. The ends of the outer leads are soldered to the substrate. The portion where the light emitting diode is mounted is sealed with the transparent resin on the overall periphery, so that the heat from the light emitting diode is mainly transmitted to the lead, and is radiated to the substrate.

Each lead is separated and formed from a lead frame. As a material of the lead frame, an article that is the copper, which is a material having high thermal conductivity and electric conductivity, coated with a plating film for oxidation prevention is widely used.

A luminescent device is expected as a new-generation light source following an incandescent lamp and a fluorescent lamp, and is required for the higher luminance. As one of the means for realizing the high luminance, supplying a large current to a light emitting diode may be cited.

However, the efficiency of the present light emitting diode is said to be 10 to 20%, and the remaining 80 to 90% of the electric energy is converted to heat. As the operation temperature rises, the efficiency of the light emitting diode lowers, and when the operation temperature becomes higher than 130° C., the deterioration of the light emitting diode itself proceeds.

Therefore, to operate the light emitting diode by a large current, it is necessary to improve the heat radiation from the light emitting diode. Products having a constitution designed so as to enhance the heat radiation are manufactured by various companies for manufacturing luminescent devices.

In such products, the sectional area is increased by changing the width and the thickness of the lead, and thus the heat capacity and heat resistance of the leads are improved, or each inner lead is made contact with a heat sink composed of a copper block and is formed integrally with it, and thus the diffusion of heat is promoted.

However, when additional parts are introduced like these, the number of the parts of the luminescent device is increased, the constitution thereof is complicated, and thus the productivity therefor gets worse. Further, the parts of the luminescent device are made larger, and thus the problems arise that an increase in the part weight results and the size of each part itself does not correspond to its use.

For example, when intending to build in a flash in a mobile phone having a built-in image pickup device, it is necessary for the flash source to emit light as bright as possible and to be as small and light as possible. But it is difficult to provide a bright light source suited to such a use.

SUMMARY OF THE INVENTION

Accordingly, one object of the present invention is to provide a luminescent device which can radiate efficiently heat from a light emitting diode with a simple construction and a small size.

Another object of the present invention is to provide a method for manufacturing a luminescent device easily which can radiate efficiently heat from a light emitting diode with a simple construction and a small size.

According to an aspect of the present invention, there is provided a luminescent device including a die pad lead composed of an inner lead and an outer lead, a case for uniting the inner lead, a light emitting diode chip mounted on a first predetermined position of one main surface of the inner lead, and a transparent sealing material portion mainly composed of a material for transmitting light emitted from the light emitting diode chip for sealing the light emitting diode chip and a part of the one main surface of the inner lead. The case seals the inner lead other than an area sealed by the transparent sealing material portion, and the inner lead of the die pad lead has bending portions at least two places, including a first bending portion and a second bending portion. A rear of the first predetermined position where the light emitting diode chip is mounted from the first bending portion in the inner lead of the die pad lead is exposed outside the case, and the second bending portion is formed in the case so that the outer lead extends from a side of the case.

According to another aspect of this invention, there is provided a method for manufacturing a luminescent device including, preparing a die pad lead composed of an inner lead and an outer lead, bending the inner lead of the die pad lead at least two places including a first bending portion and a second bending portion, and uniting the inner lead to a case. The first bending portion is formed in the case such that a rear of a predetermined position of one main surface of the inner lead from the first bending portion is exposed outside the case, and the second bending portion is formed in the case so that the outer lead extends from a side of the case. The method further includes, mounting a light emitting diode chip on the predetermined position of the inner lead of the die pad lead.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
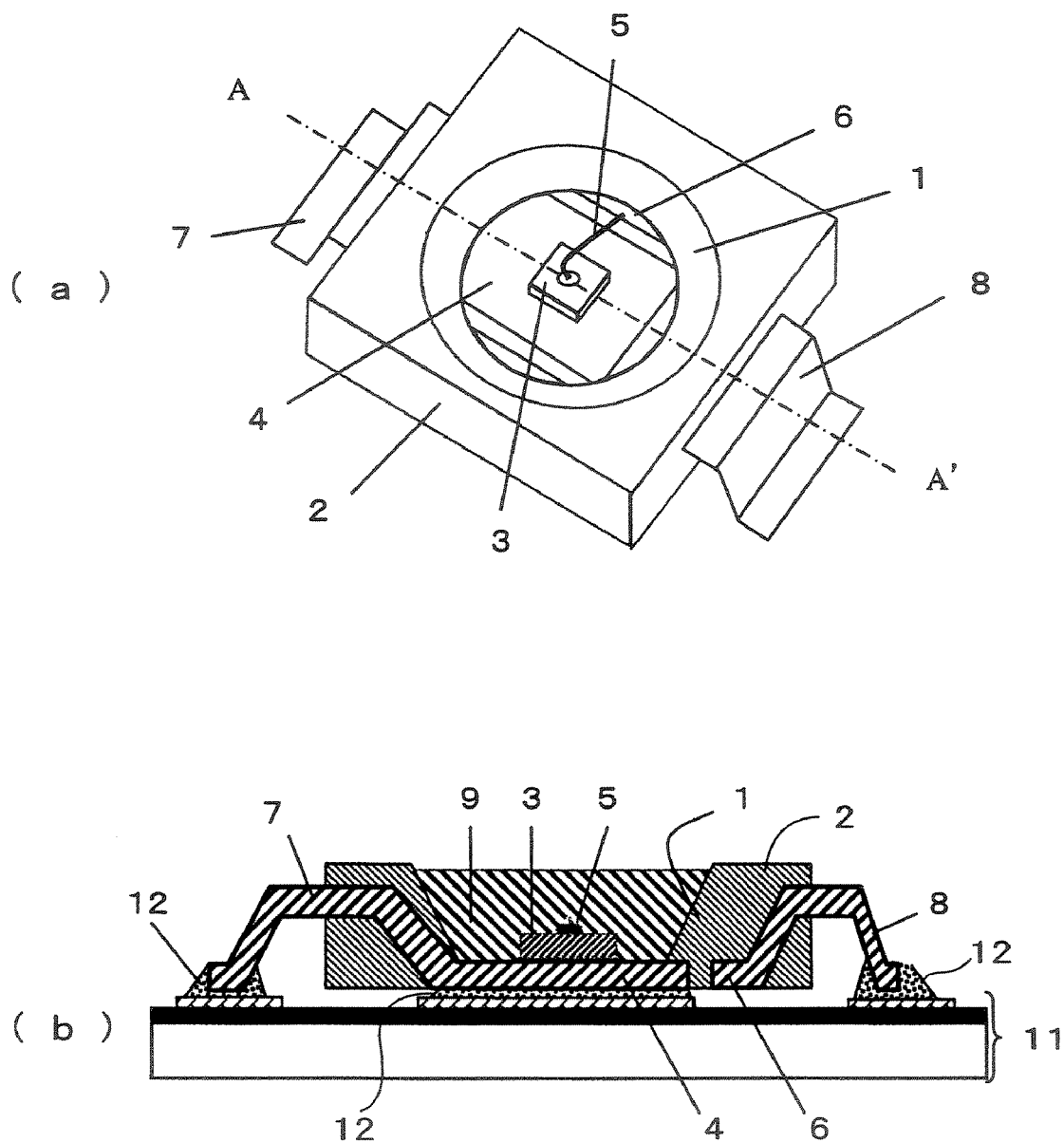
FIG. 1 is a perspective view of a luminescent device according to an embodiment of the present invention.

Referring now to the drawings, wherein like reference numerals designate identical or corresponding parts throughout the several views, the embodiments of this invention will be described below.

FIG. 1(a) shows a perspective view of a luminescent device according to an embodiment of this invention, and FIG. 1(b) shows a sectional view of a line A-A' of the luminescent device of the embodiment shown in FIG. 1(a).

The luminescent device shown in FIG. 1(a) is composed of a case 2 having an opening 1 in a conical shape, a light emitting diode chip 3 exposed on the bottom of opening 1 in the conical shape, an inner lead 4 on a die pad side for forming a die pad to which the light emitting diode chip 3 is mounted, a wire 5 extending from an electrode on the surface of light emitting diode chip 3, an inner lead 6 on a wire pad side for forming a wire pad to which the other end of wire 5 is connected, an outer lead 7 on the die pad side which is continued to inner lead 4 on the die pad side in case 2 and extends outward from the side of case 2, an outer lead 8 on the wire pad side which is continued to inner lead 6 on the wire pad side in case 2 and extends outward from another side of case 2, and a transparent resin material portion 9 which is formed so as to fill up opening 1 in the conical shape, seals light emitting diode chip 3, a part of inner lead 4 on the die pad side, wire 5, and a part of inner lead 6 on the wire pad side, and transmits light emitted from light emitting diode chip 3. Further, the shape of opening 1 may not be always in the conical shape.

The sectional view of the luminescent device shown in FIG. 1(b) shows a situation that outer leads 7 and 8 of the luminescent device are soldered using solder paste 12 to wiring substrate 11 of an external apparatus composing a main unit of, for example, a mobile phone. The luminescent device is formed so that a main surface of the die pad on the side where no light emitting diode chip 3 is mounted is exposed outside case 2. Further, an exposed portion of inner lead 4 on the die pad side is connected to an electrode on the wiring substrate side using solder paste 12.

For wiring substrate 11, a metal core substrate may be used. For example, to a metal core substrate formed so as to laminate sequentially a resin layer and a wiring pattern on a base of an aluminum plate, the exposed portion of inner lead 4 on the die pad side is connected by solder paste 12.

At this time, the heat generated by light emitting diode chip 3 is mainly transferred outside the luminescent device in the order of AuSn solder (described later), the die pad, and solder paste 12. The heat resistance in this path is about 16° C./W, and it is about a half of that of a conventional case using copper leads in the same thickness. In the luminescent device in this constitution, a large current of 500 mA can be supplied to the light emitting diode chip 3.

Case 2 unites and holds a pair of leads by a white resin material. The external dimensions of case 2 are 5 mm×5 mm×1 mm. At the center of one main surface of case 2, opening 1 in the conical shape is formed, and the angle of the side wall of opening 1 in the conical shape is an inclination of 45° viewed from the plane of the main surface of the die pad exposed in opening 1 in the conical shape.

Light emitting diode chip 3 is a blue LED, and the external dimensions thereof are 1.0 mm×1.0 mm×0.2 mm. The electrodes of light emitting diode chip 3 are arranged on the top and bottom surface. Light emitting diode chip 3 is fixed at the bottom to the die pad by AuSn solder not shown, and is electrically connected to the die pad. The top electrode is connected to the wire pad via wire 5 composed of Au with a diameter of 35 μm.

Light emitting diode chip 3 is sealed by transparent resin material portion 9 of silicone or epoxy series added with fluorescent substance. Here, the fluorescent substance added has a property of converting blue light to yellow light, and the amount and the material thereof are decided so that the blue light emitted directly outside from light emitting diode chip 3 is mixed with yellow light from the fluorescent substance to become white light. This mixed light is called a pseudo-white light.

The leads are composed of a set of two leads which are a lead on the die pad side and a lead on the wire pad side. For forming the leads, a pure copper plate with a thickness of 200 μm is used whose surface is coated with a plated film for oxidation prevention. As a material of the plated film, silver and nickel can be used. A lead frame is formed by punching the copper plate, furthermore the portion of the lead frame from which leads are formed is pressed, and thus the leads used in this embodiment are formed.

The tip of each inner lead is formed in a rectangular shape. The corners of each of the rectangle are not exposed in opening 1, but are arranged so as to be inserted into case 2. The die pad is structured so that both of the two corners are inserted in case 2 and a side held between the two corners is exposed in opening 1. With respect to the wire pad, one of the two corners is inserted in case 2. By use of this arrangement, the isolation of the leads due to the difference in the thermal expansion coefficient between case 2 and the leads is prevented. Further, it is designed that when pressing the leads from the rear of case 2 toward opening 1, the luminescent device is hardly decomposed.

Further, the inner leads are arranged so that the front ends thereof are not hidden perfectly, and thus by keeping the insulation distance between the inner leads sealed in case 2 and the front end of the die pad or wire pad, the leads can be arranged opposite to each other so as to be more close and can be miniaturized more.

Further, opening 1 is formed by transferring the inner convex shape inside the mold for forming case 2, and the wire pad and die pad are arranged so as to adhere closely to the convex shape. An arrangement of the inner leads so as to insert the front ends into case 2 from opening 1 results in increasing the area not closely adhered to the convex shape at the front ends of the leads. The thickness of the leads is thinned to 200 μm, so that the area not supported by case 2 is easily deformed. Thus by use of such a constitution that only the corners are inserted like this, the die pad can be prevented from the deformation due to the flow resistance of the resin, and furthermore, stable manufacture for case 2 united with leads can be realized.

FIG. 2(a) shows a perspective view of the leads used in the luminescent device according to the embodiment aforementioned.

The lead on the die pad side is composed of inner lead area 4 on the die pad side on which the light emitting diode chip 3 is mounted and outer lead area 7 on the die pad side extending outside case 2. As for the inner lead 4 on the die pad side, the die pad portion where light emitting diode chip 3 is mounted is installed from the tip of the lead toward the halfway portion thereof. Inner lead 4 on the die pad side is bent at about 40° at a first bending portion 21 so as to incline from a main surface where the light emitting diode chip 3 is mounted. When the bending angle is made equal to the inclination of the side wall of opening 1 formed on case 2, the overall size of the luminescent device can be preferably made smaller. At the position higher than first bending portion 21 by 400 µm, a second bending portion 22 is installed. Inner lead 4 is bent at second bending portion 22, and extended again in the same direction as that of the die pad portion.

Outer lead 7 on the die pad side is positioned on the extension of inner lead 4 extending from second bending portion 22, and is extended horizontally into the area outside case 2. At a third bending portion 23 installed in the halfway portion, the outer lead 7 on the die pad is bent so as to be directed in the direction crossing a virtual plane including the rear of the die pad. The bending angle is set freely within the range less than 90°. As the bending angle at third bending portion 23 increases, it contributes to miniaturization of the luminescent device. But an action of absorbing the impact load applied to the luminescent device is expected by third bending portion 23, so that it may be preferable to set the bending angle to a smaller angle depending on the use. At a fourth bending portion 24, the tip of outer lead 7 is bent so as to be formed in a shape that mounting on the wiring substrate is taken into account. That is, in this embodiment, the tip of outer lead 7 is bent so that a part of a main surface of outer lead 7 makes contact with the virtual plane including the main surface of the die pad where the light emitting diode chip 3 is not mounted. When the main surface of outer lead 7 crosses the virtual plane, it is difficult for the exposed rear of the die pad to make contact with the wiring substrate, so that the tip of outer lead 7 is preferably structured so as to be positioned not to cross the virtual plane.

Inner lead 6 on the wire pad side is formed long and narrow so that the wire pad portion to which wire 5 is connected is included in the virtual plane formed by the die pad from the lead tip toward the halfway portion of inner lead 6. Further, the wire pad is in a concave shape, as viewed from the normal line of the main plane formed by the wire pad, and is structured so as to surround the three sides opposite to the sides of the die pad. At a fifth bending portion 25, inner lead 6 on the wire pad side is bent at about 40° so as to incline from the main surface where light emitting diode chip 3 is mounted. When the bending angle is made equal to the inclination of the side wall of opening 1 formed on case 2, the overall size of the luminescent device can be preferably made smaller. At the position higher than fifth bending portion 25 by 400 µm, a sixth bending portion 26 is installed. Inner lead 6 is bent at sixth bending portion 26, and extended again in the same direction as that of the die pad portion.

Outer lead 8 on the wire pad side is positioned on the extension of inner lead 6 extending from sixth bending portion 26, and is extended horizontally into the area outside case 2. At a seventh bending portion 27 installed in the halfway portion, outer lead 8 on the wire pad is bent so as to be directed in the direction crossing the virtual plane including the rear of the die pad. The bending angle is set freely within the range less than 90°. As the bending angle at seventh bending portion 27 increases, it contributes to miniaturization of the luminescent device. But an action of absorbing the impact load applied to the luminescent device is expected by seventh bending portion 27, so that it may be preferable to set the bending angle to a smaller angle depending on the use. At an eighth bending portion 28, the tip of outer lead 8 is bent so as to be formed in a shape that mounting on the wiring substrate is taken into account. That is, in this embodiment, the tip of outer lead 8 is bent so that a part of the main surface of outer lead 8 makes contact with the virtual plane including the main surface of the die pad where light emitting diode chip 3 is not mounted. When the main surface of outer lead 8 crosses the virtual plane, it is difficult for the exposed rear of the die pad to make contact with the wiring substrate, so that the tip of outer lead 8 is preferably structured so as to be positioned not to cross the virtual plane.

The pair of leads shown in FIG. 2(a) are arranged opposite to each other, and at the outside ends thereof, the tips of the outer leads are arranged. Inner lead 6 on the wire pad side is forked and formed so as to sandwich the die pad. By doing this, when a plurality of light emitting diode chips are mounted on the die pad, the gold wires can be handled easily. When only one light emitting diode chip is mounted, a lead frame in a shape as shown in FIG. 2(b) may be used.

The lead shown in FIG. 2(b) has a constitution that in the lead constitution shown in FIG. 2(a), one out of the two wire pads is removed. Simply, in the lead constitution shown in FIG. 2(a), the second wire pad is cut off along the side thereof arranged opposite to the die pad. By doing this, the luminescent device of this embodiment can be structured so as to narrow the width in correspondence to the cut-off wire pad.

A lead shown in FIG. 2(c) is structured such that in the lead constitution shown in FIG. 2(b), the shape of inner lead 6 on the wire pad side is modified. Concretely, a ninth bending portion 29 corresponding to fifth bending portion 25 is installed on the wire pad.

The wire pad is formed in an extremely narrower width than that of the inner lead on the wire pad side. Concretely, the width of the wire pad is the width of the inner lead on the wire pad side minus the sum of the die pad width and cut-off width. A constitution is used that from the halfway part of the wire pad formed in a narrow width like this, the inner lead is drawn into case 2 is used.

The wire pad is originally a portion generating no heat, so that there are few advantages in that it is externally exposed. When the portion in a wider width is sealed inside case 2, the contact area between the resin and the lead is increased, and thus it contributes to improvement of the junction strength.

Further, the portion in a wider width opposite to the tip of the die pad is arranged higher in the vertical direction from the plane of the die pad. As a result, even if the distance between the inner lead on the die pad side and the inner lead on the wire pad side is shortened more, the insulation distance can be kept.

The reason that the wire pad is installed at the same height as that of the die pad even in the structure shown in FIG. 2(c) is that it is taken into account to keep the loop of wire 5 low. When the wire pad is installed at a higher position, the highest point of the loop formed by wire 5 also rises, and thus the overall luminescent device becomes thick. Another reason relates to the productivity in forming the leads. When the height of the die pad and that of the wire pad are different, in correspondence to it, the mold must be worked finely.

The wire pad and the die pad are narrow such as 2 mm in width. The thickness thereof is also thin such as 200 µm, so that it is worried that the adhesive strength with the resin material forming case 2 may be lowered. It is effective to increase the adhesion surface with the resin by making through holes in the lead frame, which can be processed comparatively easily. However, as the lead frame is thinned, the surface area adhered to the resin is reduced, so that the effect thereof is also lowered. When the lead frame is thick, the adhesion area is large and the lead frame is transformed little, so that the countermeasures for the separation and omission are not questionable. But when the lead frame is thinned, a countermeasure for it becomes necessary.

Figure 2:
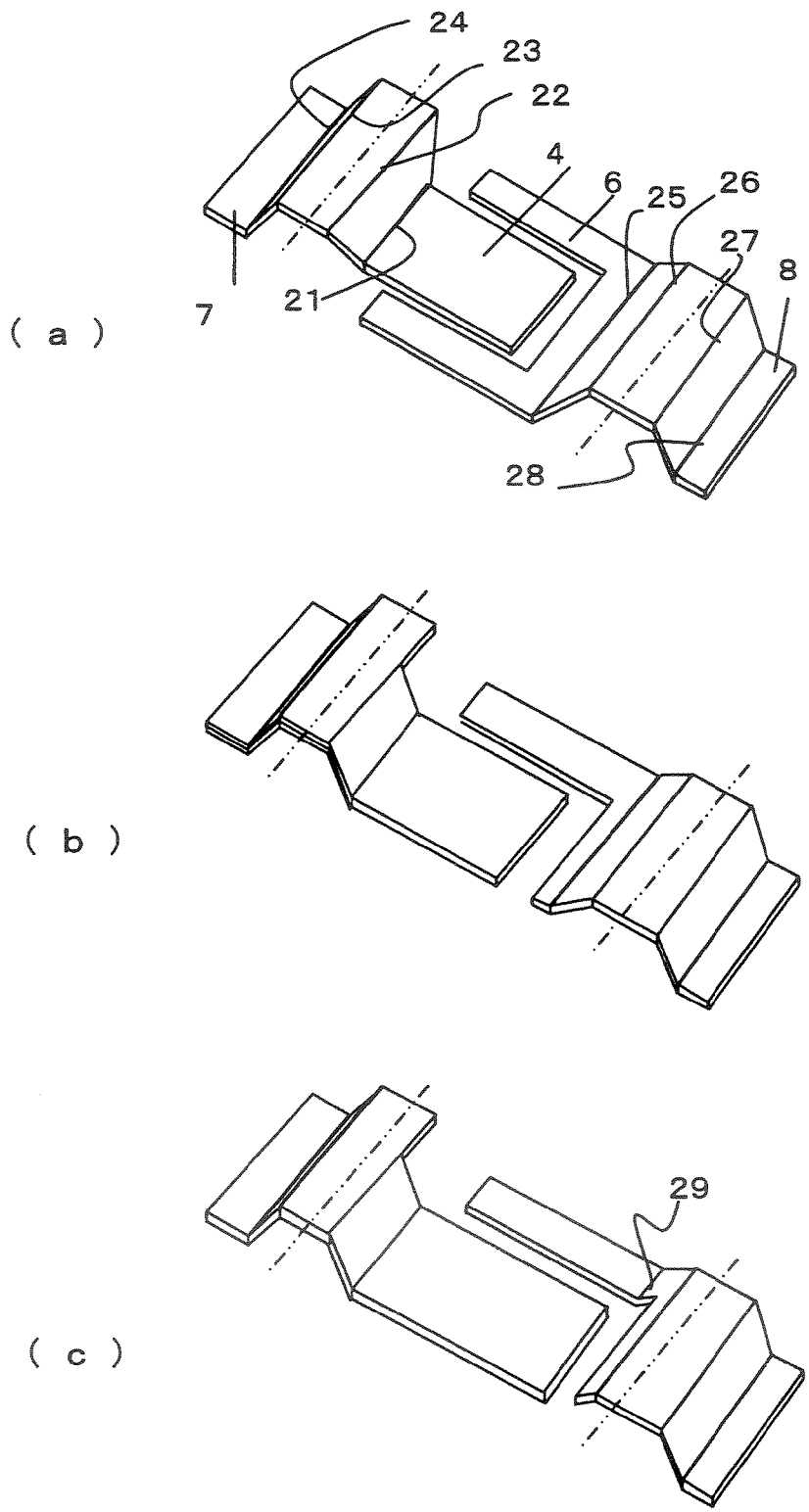
FIG. 2 is a perspective view of the luminescent device according to the embodiment of the present invention.

To prevent the separation of the lead frame from the resin forming case 2, some portions of the sharp edge of the lead frame on the exposure side are removed or chamfered (not shown in FIG. 2). These portions are called a compression portion, and the resin is filled in the compression portion. Thus this is used as a means for preventing separation caused by the external force and the transformation. Further, by using together and combining the through holes, a higher effect can be obtained. The lead frame is formed by pressing a metallic plate with a uniform thickness, so that at this time, at one side or both sides of the lead frame, at least the edge line of the exposed side, the compressed shape is transferred.

By doing this, the lead frame can be thinned, and this contributes to the realization of the light weight and the miniaturization of the luminescent device. Addition of the compressed shape to the lead frame does not need complicated machining, and can be done easily by pressing, so that it is effective from the standpoint of cost.

Figure 3:
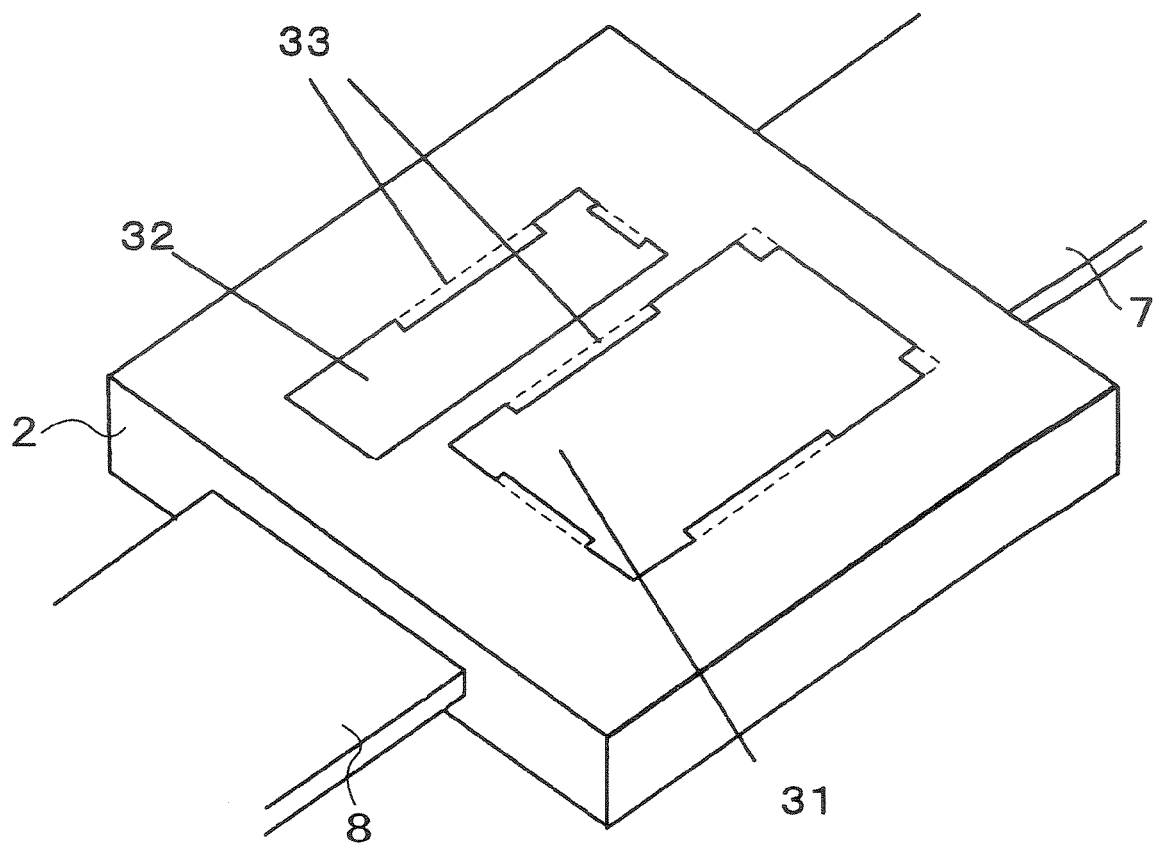
FIG. 3 is a perspective view showing the lead frame shape according to the embodiment of the present invention.

FIG. 3 shows a perspective view of the luminescent device when the leads shown in FIG. 2(c) are used.

FIG. 3 is a perspective view of the rear of the luminescent device. From both ends of case 2, outer lead 7 on the die pad side and outer lead 8 on the wire pad side are projected. On the surface of case 2, a rear 31 of the die pad and a rear 32 of the wire pad are exposed. On the outlines of exposed rear 31 of the die pad and exposed rear 32 of the wire pad, concave shapes 33 are formed. These concave shapes 33 are formed corresponding to compression portions of the leads, and are formed by filling up the resin material forming case 2 in the compression portions transferred to the edge lines of the leads as shown in FIG. 3.

As mentioned above, in this embodiment, a structure is formed so as to hold the leads in case 2, so that even the thinned leads are not separated and removed easily.

Further, when the edges of the leads are compressed, the leads are hardly bent. Therefore, when the leads are inserted into the mold and resin is injected, the deformation amount of the leads is suppressed and stable production is enabled.

As a means for realizing the higher brightness of the luminescent device, changing the mounting of the light emitting diode chip from the conventional wire bonding to a flip chip bonding may be cited. In the case of the wire bonding, the electrode and the wire installed on the top of the chip interrupt the light from the light emitting diode chip, and the brightness is lowered in correspondence to it. When a mounting system is changed to the flip chip bonding, this problem can be solved.

The light emitting diode chip is sensitive to the counter electromotive force and the static electricity, and has a property of immediately being broken by them. Generally, to ensure the connection reliability of the bump junction, the light emitting diode chip is mounted on the lead frame via a substrate prepared by a material, such as silicon or alumina, having a thermal expansion coefficient close to that of the light emitting diode chip. This system is called a sub-mount system.

When forming the luminescent device by using the sub-mount system, a method for mounting the light emitting diode chip and the sub-mount substrate which are united beforehand on the lead may be used. In this case, at the stage before the sub-mount substrates are individualized from a silicon wafer, the light emitting diode chips are mounted by the flip chip bonding for all the wires, and after pairs of the light emitting diode chips and sub-mount substrates are structured, the pairs are isolated from the silicon wafer.

In this embodiment, however, the step of the system for mounting the light emitting diode chip and sub-mount substrate separately in the lead frame will be explained.

Figure 4:
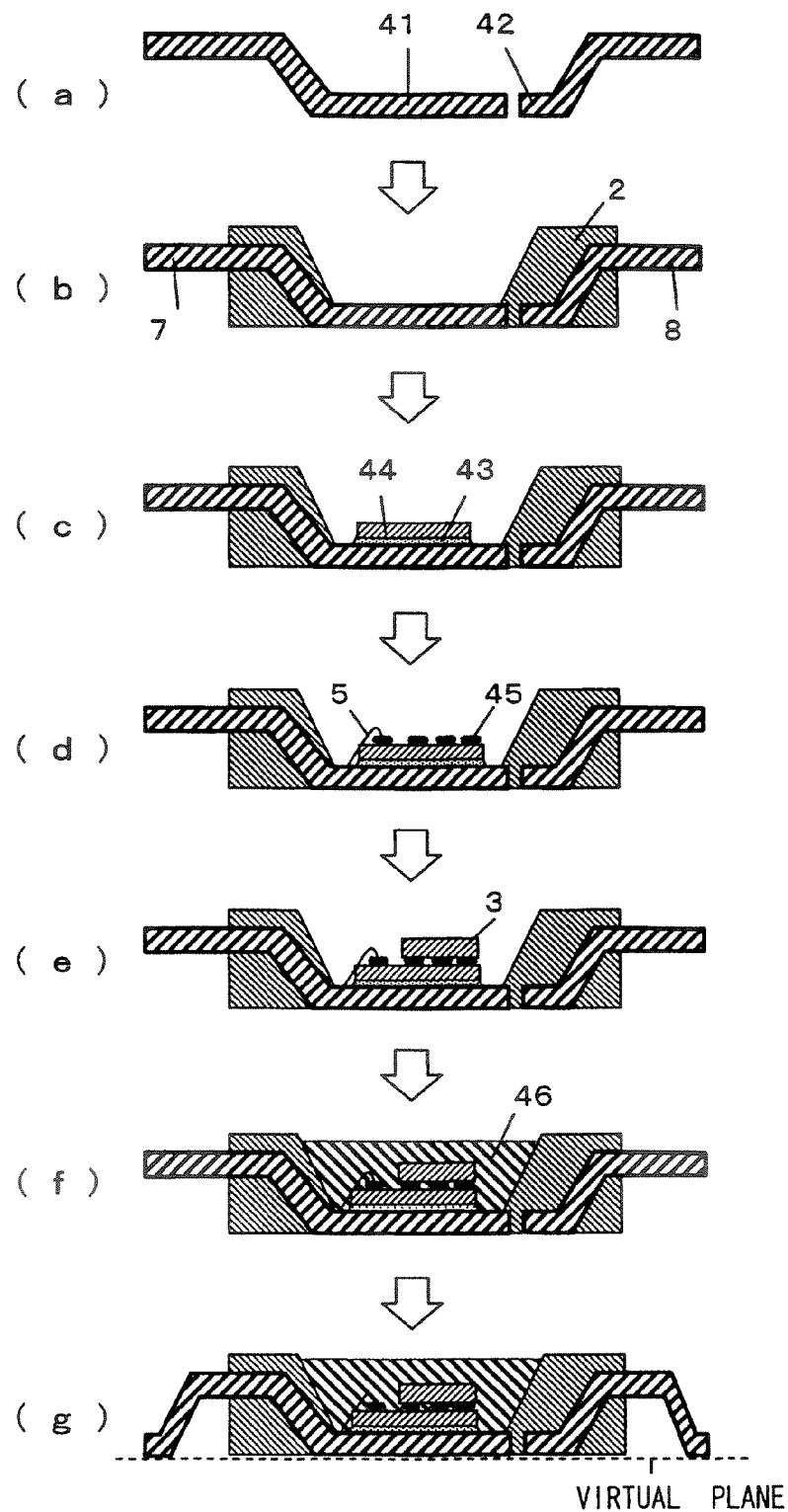
FIG. 4 is a schematic view showing a process for manufacturing a luminescent device according to an embodiment of the present invention.

FIG. 4 shows a schematic view showing a method for manufacturing a luminescent device according to an embodiment of the present invention.

Firstly, front ends of inner leads of a lead frame are depressed, and thereby a die pad 41 and a wire pad 42 are formed (refer to FIG. 4(a)).

Next, the lead frame is inserted into an injection forming mold. Outer lead portions 7 and 8 are held by the mold, die pad 41 and wire pad 42 are made contact with the convex portion of the mold, white epoxy resin is injected into the cavity, and thus case 2 is obtained (refer to FIG. 4(b)).

Next, the lead frame is taken out from the mold and die pad 41 is coated with conductive adhesive 43. Then a wiring substrate that the wiring pattern is formed on the surface of a substrate of silicon is mounted to the lead frame with conductive adhesive 43 (refer to FIG. 4(c)). This wiring substrate is called a sub-mount 44. The size thereof is 2.0 mm×3.0 mm×0.2 mm. The wiring pattern formed on the main surface of the wiring substrate is structured by etching a metallic film that Ti, Ni, and Au are laminated sequentially in this order from the silicon side so as to obtain a predetermined pattern.

Next, on the electrode on the surface of sub-mount 44, six gold ball bumps 45 are formed. Another electrode of sub-mount 44 and wire pad 42 are connected by gold wire 5 (refer to FIG. 4(d)). Here, in FIG. 4(d) it may be seen that gold wire 5 is connected to die pad 41. But, this is because FIG. 4(d) shows the sectional view. Actually, gold wire 5 is connected to wire pad 42 which is located beyond die pad 41 in FIG. 4(d). The size of each of the bumps is 100 μm in diameter and 40 μm in height.

Next, light emitting diode chip 3 is flip-chip-bonded via gold ball bumps 45 (refer to FIG. 4(e)). Here, to the sub-mount heated to 18° C. via die pad 41 at a heater stage not drawn, by pressurizing and pressing light emitting diode chip 3 by a bonding tool not shown at a load of 9 N, ultrasonic vibration is applied for 200 ms, and thus gold ball bumps 45 and the electrode of light emitting diode chip 3 are mounted. By the together use of the ultrasonic waves, the process temperature can be set to a comparatively low temperature, and the adverse effect on the resin material can be suppressed. The uppermost surface layer of the electrode of light emitting diode chip 3 is a gold film with a thickness of 0.5 μm. The junction strength between the bumps and the electrode result in the shear strength of 1 N.

Next, light emitting diode chip 3 is sealed by transparent resin 46 mixed with fluorescent substance (refer to FIG. 4(f)).

Next, the frame portions of the lead frame are cut off, outer leads 7 and 8 are bent, and thus the luminescent device is completed (refer to FIG. 4(g)).

The embodiment aforementioned has a constitution that when the neighborhood of the connection place of the light emitting diode chip to the inner lead is viewed, one main surface of the lead composed of a plate shaped member is exposed outside, and the main surface where the light emitting diode chip is mounted is sealed by the sealing resin. Therefore, a system can be constructed for externally ejecting the heat transferred from the light emitting diode chip to the inner lead using the rear surface of the exposed inner lead. The size of an external apparatus on which the luminescent device is mounted is always larger than the luminescent device, so that the heat can be ejected positively by using a larger part that is the external apparatus.

Further, by use of the aforementioned structure that the rear of the inner lead is exposed, the junction of the lead and the resin case is not strong and they may be separated and broken down from each other. To avoid such a trouble, a constitution is used that the inner lead is bent at least two places in the portion from the area where the light emitting diode chip is mounted to the outer lead and the bent portions are sealed by the resin so as to be surrounded. By this bending, such a constitution can be realized that the set sealing resin and the inner lead are intertwined structurally, are hardly applied with force in the separation direction from each other, and are not broken down easily.

Further, as for the outer lead, in order to form it so that the virtual plane including the main surface in the neighborhood of the front end of the outer lead includes the main surface of the exposed inner lead, the halfway portion in the outer lead from the inner lead to the tip of the outer lead is bent at several places. By doing this, as a structure for transferring the heat from the exposed main surface of the inner lead to the external apparatus, using the same material as the solder material used when electrically joining the outer lead to the wiring substrate, they can be joined easily.

By use of such a constitution, a luminescent device can be structured for simplifying the overall constitution thereof, facilitating a heat radiation design even if it is small, and ensuing the reliability.

Further, the assembly cost can be reduced to a half of that or less compared with that in a case that a conventional thick lead frame is used.

Further, in the process of the embodiment aforementioned, a structure is used that the light emitting diode chip is flip-chip bonded using gold ball bumps. For the gold ball bump, a metallic bump formed beforehand by the plating system can be substituted.

Further, this invention can be applied to a luminescent device of a type using no fluorescent substance.

Further, a portion of an edge line of the inner lead exposed from the case may be chamfered.

Obviously, numerous modifications and variations of the present invention are possible in light of the above teachings. It is therefore to be understood that within the scope of the appended claims, the invention may be practiced otherwise than as specifically described herein.

What is claimed is:

1. A luminescent device, comprising:
   a die pad lead composed of an inner lead and an outer lead;
   a case;
   a light emitting diode chip mounted on a first predetermined position of one main surface of said inner lead;
   a transparent sealing material portion mainly composed of a material for transmitting light emitted from said light emitting diode chip for sealing said light emitting diode chip and a part of said one main surface of said inner lead;
   said case sealing said inner lead other than an area sealed by said transparent sealing material portion;
   said inner lead of said die pad lead having bending portions at least two places, including a first bending portion and a second bending portion;
   a rear of said first predetermined position where said light emitting diode chip is mounted from said first bending portion in said inner lead of said die pad lead being exposed outside said case;
   said second bending portion being formed in said case so that said outer lead extends from a side of said case;
   said outer lead of said die pad lead has bending portions at least two places, including a third bending portion and a fourth bending portion;
   said third bending portion is formed so as to bring said extending direction of said outer lead of said die pad lead close to a virtual plane including said exposed main surface of said inner lead of said die pad lead; and
   said fourth bending portion is formed so that a part of said outer lead of said die pad lead makes contact with said virtual plane;
   a wire pad lead composed of an inner lead and an outer lead; and
   a wire connecting an electrode of said light emitting diode chip and a second predetermined position of one main surface of said inner lead of said wire pad lead;
   wherein said wire and said second predetermined position are sealed by said transparent sealing material portion;
   another main surface of said inner lead of said wire pad lead in the neighborhood of said second predetermined position is exposed from said case so as to make contact with said virtual plane including said exposed main surface of said inner lead of said die pad lead;
   said inner lead of said wire pad lead has bending portions at least two places, including a fifth bending portion and a sixth bending portion;
   a rear of said second predetermined position where said wire is joined from said fifth bending portion is exposed outside said case;
   said sixth bending portion is formed in said case so that said outer lead of said wire pad lead extends from a side of said case;
   said inner lead of said die pad lead having a first side opposing said first bending portion and two second sides, the second sides each extending between said first side and said first bending portion;
   said wire pad lead having a third side opposing said first side of said inner lead of the die pad lead and said inner lead of the wire pad lead having an extending portion that extends from said third side toward towards said die pad lead along one of said second sides; and
   said wire extending from said electrode across said one of said second sides to said second predetermined position.

2. The luminescent device according to claim 1, wherein:
   said outer lead of said wire pad lead has bending portions at least two places, including a seventh bending portion and an eighth bending portion;
   said seventh bending portion is formed so as to bring said extending direction of said outer lead of said wire pad lead close to said virtual plane including said exposed main surface of said inner lead of said die pad lead; and
   said eighth bending portion is formed so that a part of said outer lead of said wire pad lead makes contact with said virtual plane.

3. The luminescent device according to any of claims 1 or 2, wherein:
   at least an edge line portion of said inner lead exposed from said case is compressed or chamfered.

4. The luminescent device according to any of claims 1 or 2, wherein:
   corners of a tip of said inner lead are arranged in said case; and
   a side of said inner lead held between said corners is arranged in an opening of said case so as to expose from said case.

5. The luminescent device according to claim 1, wherein:
   said extending portion extends along said one of said second sides to a position adjacent to said first predetermined position.

6. The luminescent device according to claim 1, wherein:
   said extending portion extends along said one of said second sides to a position past said first predetermined position.

7. The luminescent device according to claim 1, comprising:
   another said extending portion extending along a second one of said second sides to a position adjacent to said first predetermined position.

8. A method for manufacturing a luminescent device, comprising:
preparing a die pad lead composed of an inner lead and an outer lead;
preparing a wire pad lead composed of an inner lead and an outer lead;
bending said inner lead of said die pad lead at least two places, including a first bending portion and a second bending portion said inner lead of said die pad lead having a first side opposing said first bending portion and two second sides, the second sides each extending between said first side and said first bending portion;
preparing a case;
said first bending portion being formed in said case such that a rear of a first predetermined position of one main surface of said inner lead from said first bending portion is exposed outside said case; and
said second bending portion being formed in said case so that said outer lead extends from a side of said case;
mounting a light emitting diode chip on said first predetermined position of said inner lead of said die pad lead;
connecting a wire to an electrode of said light emitting diode chip and a second predetermined position of a main surface of said inner lead of said wire pad lead;
arranging said wire pad lead to have a third side opposing said first side of said inner lead of the die pad lead and said inner lead of the wire pad lead to have an extending portion that extends from said third side towards said die pad lead along one of said second sides; and
arranging said wire to extend from said electrode across said one of said second sides to said second predetermined position.

9. The method for manufacturing a luminescent device according to claim 8, further comprising:
sealing said light emitting diode chip and a part of said one main surface of said inner lead by a transparent sealing material portion mainly composed of a material for transmitting light emitted from said light emitting diode chip.

10. The method for manufacturing a luminescent device according to claim 8, comprising:
arranging said extending portion to extend along said one of said second sides to a position adjacent to said first predetermined position.

11. The method for manufacturing a luminescent device according to claim 8, comprising:
arranging said extending portion to extend along said one of said second sides to a position past said first predetermined position.

12. The method for manufacturing a luminescent device according to claim 8, comprising:
arranging said wire pad lead to have another said extending portion extending along a second one of said second sides to a position adjacent to said first predetermined position.

13. A luminescent device, comprising:
a die pad lead composed of an inner lead and an outer lead formed in one first body;
a case;
a light emitting diode chip mounted on a first predetermined position of one main surface of said inner lead; and
a transparent sealing material portion mainly composed of a material for transmitting light emitted from said light emitting diode chip for sealing said light emitting diode chip and a part of said one main surface of said inner lead;
said case sealing said inner lead other than an area sealed by said transparent sealing material portion;
said inner lead of said die pad lead having linear bending portions at least two places, including a first linear bending portion and a second linear bending portion;
a rear of said first predetermined position where said light emitting diode chip is mounted from said first linear bending portion in said inner lead of said die pad lead being exposed outside said case;
said second linear bending portion being formed in said case so that said outer lead extends from a side of said case;
said outer lead of said die pad lead has linear bending portions at least two places, including a third linear bending portion and a fourth linear bending portion;
said third linear bending portion is formed so as to bring said extending direction of said outer lead of said die pad lead close to a virtual plane including said exposed main surface of said inner lead of said die pad lead; and
said fourth linear bending portion is formed so that a part of said outer lead of said die pad lead makes contact with said virtual plane;
a wire pad lead composed of an inner lead and an outer lead formed in one second body; and
a wire connecting an electrode of said light emitting diode chip and a second predetermined position of one main surface of said inner lead of said wire pad lead;
wherein said wire and said second predetermined position are sealed by said transparent sealing material portion;
another main surface of said inner lead of said wire pad lead in the neighborhood of said second predetermined position is exposed from said case so as to make contact with said virtual plane including said exposed main surface of said inner lead of said die pad lead;
said inner lead of said wire pad lead has linear bending portions at least two places, including a fifth linear bending portion and a sixth linear bending portion;
a rear of said second predetermined position where said wire is joined from said fifth linear bending portion is exposed outside said case;
said sixth linear bending portion is formed in said case so that said outer lead of said wire pad lead extends from a side of said case;
said outer lead of said wire pad lead has linear bending portions at least two places, including a seventh linear bending portion and an eighth linear bending portion;
said seventh linear bending portion is formed so as to bring said extending direction of said outer lead of said wire pad lead close to said virtual plane including said exposed main surface of said inner lead of said die pad lead;
said eighth linear bending portion is formed so that a part of said outer lead of said wire pad lead makes contact with said virtual plane;
the die pad lead has a configuration provided with a convex portion ranging from the first linear bending portion to the fourth linear bending portion in cross section in the length direction of the die pad lead;
the wire pad lead has a configuration provided with a convex portion ranging from the fifth linear bending portion to the eighth linear bending portion in cross section in the length direction of the wire pad lead; said inner lead of said die pad lead having a first side opposing said first bending portion and two second sides, the second sides each extending between said first side and said first bending portion;

said wire pad lead having a third side opposing said first side of said inner lead of the die pad lead and said inner lead of the wire pad lead having an extending portion that extends from said third side towards said die pad lead along one of said second sides; and said wire extending from said electrode across said one of said second sides to said second predetermined position.

14. A luminescent device, comprising:

a die pad lead composed of an inner lead and an outer lead formed in one first body;

a case;

a light emitting diode chip mounted on a first predetermined position of one main surface of said inner lead;

a transparent sealing material portion mainly composed of a material for transmitting light emitted from said light emitting diode chip for sealing said light emitting diode chip and a part of said one main surface of said inner lead;

said case sealing said inner lead other than an area sealed by said transparent sealing material portion;

said inner lead of said die pad lead having bending portions at least two places, including a first bending portion and a second bending portion;

a rear of said first predetermined position where said light emitting diode chip is mounted from said first bending portion in said inner lead of said die pad lead being exposed outside said case;

said second bending portion being formed in said case so that said outer lead extends from a side of said case;

a wire pad lead composed of an inner lead and an outer lead formed in one second body; and a wire connecting an electrode of said light emitting diode chip and a second predetermined position of one main surface of said inner lead of said wire pad lead;

wherein said wire and said second predetermined position are sealed by said transparent sealing material portion;

another main surface of said inner lead of said wire pad lead in the neighborhood of said second predetermined position is exposed from said case so as to make contact with a virtual plane including said exposed main surface of said inner lead of said die pad lead;

said inner lead of said wire pad lead has bending portions at least two places, including a fifth bending portion and a sixth bending portion;

a rear of said second predetermined position where said wire is joined from said fifth bending portion is exposed outside said case;

said sixth bending portion is formed in said case so that said outer lead of said wire pad lead extends from a side of said case;

a portion of a first side of said inner lead of the die pad lead corresponding to where the light emitting diode is mounted on the first predetermined position is arranged adjacent to a portion of a second side of the inner lead of the wire pad lead corresponding to where the wire is connected on the second predetermined position, said first and second sides extending in a direction from the first bending portion towards the fifth bending portion;

said inner lead of said die pad lead having a first side opposing said first bending portion and two second sides, the second sides each extending between said first side and said first bending portion;

said wire pad lead having a third side opposing said first side of said inner lead of the die pad lead and said inner lead of the wire pad lead having an extending portion that extends from said third side towards said die pad lead along one of said second sides; and said wire extending from said electrode across said one of said second sides to said second predetermined position.

15. The luminescent device according to claim 14, wherein:

said outer lead of said die pad lead has bending portions at least two places, including a third bending portion and a fourth bending portion;

said third bending portion is formed so as to bring said extending direction of said outer lead of said die pad lead close to said virtual plane including said exposed main surface of said inner lead of said die pad lead;

said fourth bending portion is formed so that a part of said outer lead of said die pad lead makes contact with said virtual plane;

said outer lead of said wire pad lead has bending portions at least two places, including a seventh bending portion and an eighth bending portion;

said seventh bending portion is formed so as to bring said extending direction of said outer lead of said wire pad lead close to said virtual plane including said exposed main surface of said inner lead of said die pad lead; and said eighth bending portion is formed so that a part of said outer lead of said wire pad lead makes contact with said virtual plane.

* * * * *